United States Patent
Setoyama et al.

(10) Patent No.: US 9,211,588 B2
(45) Date of Patent: Dec. 15, 2015

(54) SURFACE-COATED CUTTING TOOL

(71) Applicant: Sumitomo Electric Hardmetal Corp., Itami-shi (JP)

(72) Inventors: Makoto Setoyama, Itami (JP); Akihiko Shibata, Itami (JP); Yinxue Xiao, Itami (JP); Akira Kobayashi, Mie-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 62 days.

(21) Appl. No.: 14/236,885

(22) PCT Filed: Jun. 24, 2013

(86) PCT No.: PCT/JP2013/067248
§ 371 (c)(1),
(2) Date: Feb. 3, 2014

(87) PCT Pub. No.: WO2014/002948
PCT Pub. Date: Jan. 3, 2014

(65) Prior Publication Data
US 2014/0193623 A1 Jul. 10, 2014

(30) Foreign Application Priority Data

Jun. 29, 2012 (JP) ................................ 2012-147211

(51) Int. Cl.
| B23B 27/14 | (2006.01) |
| C23C 14/06 | (2006.01) |
| B23B 51/00 | (2006.01) |
| B23C 5/16 | (2006.01) |
| B23B 9/00 | (2006.01) |
| C23C 14/02 | (2006.01) |
| C23C 28/04 | (2006.01) |
| C23C 28/00 | (2006.01) |
| B32B 15/01 | (2006.01) |

(52) U.S. Cl.
CPC . *B23B 27/14* (2013.01); *B23B 9/00* (2013.01); *B23B 51/00* (2013.01); *B23C 5/16* (2013.01); *B32B 15/01* (2013.01); *C23C 14/024* (2013.01); *C23C 14/0641* (2013.01); *C23C 28/042* (2013.01); *C23C 28/044* (2013.01); *C23C 28/42* (2013.01); *Y10T 428/2495* (2015.01); *Y10T 428/24975* (2015.01); *Y10T 428/25* (2015.01); *Y10T 428/264* (2015.01); *Y10T 428/265* (2015.01)

(58) Field of Classification Search
USPC ............ 51/307, 309; 428/216, 336, 697, 698, 428/699
See application file for complete search history.

(56) References Cited

U.S. PATENT DOCUMENTS

| 6,824,601 | B2 * | 11/2004 | Yamamoto et al. | 428/698 |
| 7,901,796 | B2 * | 3/2011 | Fukui et al. | 428/697 |
| 7,947,363 | B2 * | 5/2011 | Xu et al. | 51/309 |
| 7,989,093 | B2 * | 8/2011 | Myrtveit | 428/699 |
| 8,227,098 | B2 * | 7/2012 | Åstrand | 51/307 |
| 8,685,530 | B2 * | 4/2014 | Koike et al. | 428/336 |
| 8,784,977 | B2 * | 7/2014 | Miura | 428/216 |
| 2002/0168552 | A1 | 11/2002 | Yamamoto et al. | |
| 2004/0237840 | A1 | 12/2004 | Yamamoto et al. | |
| 2005/0186448 | A1 | 8/2005 | Yamamoto et al. | |
| 2006/0029831 | A1 | 2/2006 | Lindholm et al. | |
| 2007/0269610 | A1 | 11/2007 | Fukui et al. | |
| 2010/0330360 | A1 | 12/2010 | Tanibuchi et al. | |
| 2011/0303061 | A1 | 12/2011 | Sundstrom et al. | |
| 2012/0021199 | A1 | 1/2012 | Koike et al. | |
| 2013/0108850 | A1 | 5/2013 | Kudo et al. | |

FOREIGN PATENT DOCUMENTS

| CN | 101204865 A | 6/2008 |
| CN | 101372041 A | 2/2009 |
| CN | 1721108 B | 5/2010 |
| CN | 101959631 A | 1/2011 |
| EP | 1935999 A2 | 6/2008 |
| JP | 2003-071610 A | 3/2003 |
| JP | 2005-271133 A | 10/2005 |
| JP | 2009-125832 * | 6/2009 |
| JP | 2011-506115 A | 3/2011 |
| JP | 2011-125984 A | 6/2011 |
| JP | 5008984 B2 | 8/2012 |
| WO | WO-2006/070730 A1 | 7/2006 |
| WO | WO-2009/079184 A2 | 6/2009 |
| WO | WO-2012/005275 A1 | 1/2012 |

OTHER PUBLICATIONS

International Search Report in PCT International Application No. PCT/JP2013/067248, dated Jul. 16, 2013.
Notification of the First Office Action in Chinese Patent Application No. 2013800024921, dated Apr. 20, 2015.

* cited by examiner

*Primary Examiner* — Archene Turner
(74) *Attorney, Agent, or Firm* — Venable LLP; Michael A. Sartori; Trent B. Ostler

(57) ABSTRACT

A surface-coated cutting tool according to the present invention is a surface-coated cutting tool including a base material and a coating film formed on the base material, wherein the coating film includes at least a wear-resistant layer and an adhesion-resistant layer, the wear-resistant layer has a multi-layer structure in which an A layer of a nitride containing Ti and Al as well as a B layer of a nitride containing Al and Cr are alternately stacked, and has a cubic crystal structure, and the adhesion-resistant layer is located at an outermost surface of the coating film, is composed of a nitride expressed by $(Al_aCr_bTi_{1-a-b})N$ (wherein $a+b<0.99$, $b>0.01$, and $0.2b+0.7<a$), and has a wurtzite-type crystal structure.

19 Claims, No Drawings

SURFACE-COATED CUTTING TOOL

TECHNICAL FIELD

The present invention relates to a surface-coated cutting tool having a coating film formed on a base material.

BACKGROUND ART

Cutting tools including a drill have been used as a surface-coated cutting tool having various types of coating films formed on a base material in order to improve wear resistance and chipping resistance. In modern cutting work, high efficiency has been required and a workpiece material has become difficult to be cut due to the trend toward high strength of the workpiece material, and thus, wear of the coating film tends to progress as compared with the conventional cutting work.

Therefore, there is a need for improving the aforementioned coating film. International Patent Publication No. WO2006/070730 pamphlet (PTD 1), for example, proposes a surface-coated cutting tool including alternate layers having a particular composition as a coating film.

CITATION LIST

Patent Document

PTD 1: International Patent Publication No. WO2006/070730 pamphlet

SUMMARY OF INVENTION

Technical Problem

The surface-coated cutting tool in PTD 1 succeeded in improving the properties of the coating film to some extent. However, under the cutting work environment in these days, further improvement of performance and especially reduction in adhesion of the workpiece material to the coating film are demanded.

This is because adhesion of the workpiece material to a tip or blade edge portion of the tool causes chipping and breakage of the tool. Once the workpiece material adheres to the tip or the like of the tool, the workpiece material falls off together with a part of the coating film and the base material when the workpiece material falls off again, and abnormal progress of wear and occurrence of crack start at the falloff portion, which is presumed to cause chipping and breakage of the tool.

When the aforementioned surface-coated cutting tool is a drill, high efficiency is further required and the workpiece material becomes more difficult to be cut, and thus, wear resistance of the coating film is strongly demanded in the drill work in these days.

The present invention has been made in light of the aforementioned circumstances and an object thereof is to provide a surface-coated cutting tool in which wear resistance of a coating film is improved and adhesion of a workpiece material is reduced, thereby preventing chipping and breakage of the tool.

Solution to Problem

The inventors of the present invention have earnestly conducted studies in order to solve the aforementioned problem and obtained findings that it is the most effective to form a layer having excellent wear resistance as an inner layer of a coating film and to form a layer having excellent adhesion resistance as a surface layer. Based on these findings, the inventors of the present invention have conducted further studies of a structure of each layer and completed the present invention.

Specifically, a surface-coated cutting tool according to the present invention is a surface-coated cutting tool including a base material and a coating film formed on the base material, wherein the coating film includes at least a wear-resistant layer and an adhesion-resistant layer, the wear-resistant layer has a multilayer structure in which an A layer of a nitride containing Ti and Al as well as a B layer of a nitride containing Al and Cr are alternately stacked, and has a cubic crystal structure, and the adhesion-resistant layer is located at an outermost surface of the coating film, is composed of a nitride expressed by $(Al_aCr_bTi_{1-a-b})N$ (wherein $a+b<0.99$, $b>0.01$, and $0.2b+0.7<a$), and has a wurtzite-type crystal structure.

Preferably, in the whole of the coating film, an atomic ratio of Al to all metal atoms is higher than 0.6 and equal to or lower than 0.8, and an atomic ratio of Cr to all metal atoms is higher than 0.15 and equal to or lower than 0.3.

Preferably, the coating film has a thickness of 2 to 30 μM. Preferably, the adhesion-resistant layer has a thickness of 0.5 to 8 μm.

Preferably, assuming that T1 represents a thickness of the wear-resistant layer and T2 represents a thickness of the adhesion-resistant layer, a thickness ratio T2/T1 satisfies a relationship of $0.25 \leq T2/T1 \leq 0.55$. Preferably, assuming that Ta represents an average thickness of the A layer and Tb represents an average thickness of the B layer, a thickness ratio Tb/Ta satisfies a relationship of $1.5 \leq Tb/Ta \leq 4$. Preferably, the Ta is 1 to 10 nm and the Tb is 1.5 to 30 nm.

Preferably, the A layer is composed of a nitride expressed by $(Ti_{1-c}Al_c)N$ (wherein $0.3<c \leq 0.7$), and the B layer is composed of a nitride expressed by $(Al_eCr_{1-e})N$ (wherein $0.6<e<0.75$).

Preferably, the coating film has an intermediate layer between the base material and the wear-resistant layer, and the intermediate layer is composed of a nitride containing Ti and Al, and has a thickness of 0.01 to 0.5 μm.

Preferably, the coating film has a first adherent layer and a second adherent layer between the wear-resistant layer and the adhesion-resistant layer, the first adherent layer is located between the wear-resistant layer and the second adherent layer, is composed of a nitride containing Ti and Al, and has a thickness of 30 nm to 0.1 μm, and the second adherent layer has a multilayer structure in which a C layer being of a nitride containing Ti and Al and having the same crystal structure as that of the wear-resistant layer as well as a D layer having the same composition as that of the adhesion-resistant layer are alternately stacked, and has a thickness of 10 nm to 0.2 μm.

Advantageous Effects of Invention

The surface-coated cutting tool according to the present invention is configured as described above to thereby achieve excellent wear resistance and excellent adhesion resistance, and thus, have an excellent effect of preventing chipping and breakage very effectively.

DESCRIPTION OF EMBODIMENTS

The present invention will be described in more detail hereinafter.

<Surface-Coated Cutting Tool>

A surface-coated cutting tool according to the present invention has a configuration including a base material and a coating film formed on the base material. The aforementioned coating film preferably covers the entire surface of the base material. However, a configuration in which a part of the base material is not covered with this coating film, or a configuration in which the structure of the coating film is partially different does not depart from the scope of the present invention, either.

The aforementioned surface-coated cutting tool according to the present invention can be suitably used as a cutting tool such as a drill, an end mill, a coated cutting insert for a drill, a coated cutting insert for an end mill, a coated cutting insert for milling, a coated cutting insert for machining, a metal saw, a gear cutting tool, a reamer, and a tap. Among these, the surface-coated cutting tool according to the present invention can be excellently used particularly as the drill because of highly improved wear resistance of the coating film and resistance of the coating film to adhesion of a workpiece material.

<Base Material>

Any base materials that are conventionally known as this type of base material can be used as the base material used in the surface-coated cutting tool according to the present invention. Examples of the base material can include cemented carbide (including, for example, WC-based cemented carbide, the one containing WC and Co, and the one containing WC and Co and additionally a carbonitride of Ti, Ta, Nb or the like), cermet (having TiC, TiN, TiCN or the like as a main component), high-speed steel, ceramic (such as titanium carbide, silicon carbide, silicon nitride, aluminum nitride, and aluminum oxide), cubic boron nitride sintered body, diamond sintered body, and the like.

<Coating Film>

The coating film of the present invention is formed of a plurality of layers and includes at least a wear-resistant layer and an adhesion-resistant layer. By synergistic working of the function of each layer described below, the coating film of the present invention achieves excellent wear resistance and excellent adhesion resistance, and thus, has a very excellent effect of preventing chipping and breakage of the tool very effectively.

The aforementioned coating film preferably has a thickness of 2-30 μm (2 μm or larger and 30 μm or smaller. When a range is indicated by linking two numerical values with a mark "-" in this way in the present invention, the lower limit value and the upper limit value thereof shall be both included in this range), and more preferably 3-12 μm.

If the thickness of the coating film is smaller than 2 μm, the effect of improving wear resistance, adhesion resistance and the like does not work sufficiently in some cases. If the thickness exceeds 30 μm, the coating film itself is more likely to peel off.

Each layer forming the coating film will be described in detail below.

<Adhesion-Resistant Layer>

The adhesion-resistant layer of the present invention is located at an outermost surface of the coating film and achieves excellent adhesion resistance of preventing adhesion of the workpiece material to a tip or blade edge portion of the tool very effectively.

The aforementioned adhesion-resistant layer needs to be composed of a nitride expressed by $(Al_aCr_bTi_{1-a-b})N$ (wherein a+b<0.99, b>0.01, and 0.2b+0.7<a) and to have a wurtzite-type crystal structure.

It was found that if the aforementioned adhesion-resistant layer is formed by using AlN having a hexagonal crystal structure, the adhesion-resistant layer is excellent in adhesion resistance and slidability at high temperature, whereas the adhesion-resistant layer has a low hardness, and thus, the adhesion-resistant layer disappears in an early stage of cutting work due to wear and has a problem with sustention. Thus, in the present invention, particular amounts of Cr and Ti are added to this AlN to improve the hardness, thereby improving the sustention of the adhesion resistance dramatically. If only Cr is added, the hardness cannot be improved sufficiently. If only Ti is added, the stability at high temperature lacks. Therefore, it is important to add both Cr and Ti to AlN.

In the aforementioned equation, a and b represent atomic ratios. If a+b is equal to or larger than 0.99, an amount of Ti decreases relatively, and thus, the hardness cannot be improved sufficiently. If b is equal to or smaller than 0.01, the stability at high temperature lacks. On the other hand, if $0.2b+0.7 \geq a$, the crystal structure of a part or all of the adhesion-resistant layer changes into a cubic crystal structure at high temperature and the adhesion resistance is lost.

In other words, it is important that the adhesion-resistant layer of the present invention has a wurtzite-type crystal structure. If the adhesion-resistant layer has the other crystal structures such as the cubic crystal structure, excellent adhesion resistance cannot be obtained. In addition, the adhesion-resistant layer of the present invention preferably has a structure of nanoparticles and an average grain size of the nanoparticles is equal to or smaller than 40 nm. By making the crystal grains fine, the hardness and toughness are improved and the sustention of the adhesion-resistant layer is improved.

In this specification, "average grain size of the nanoparticles" is measured as follows. First, the coating film is cut and a cross section is observed at 20000 to 1000000-fold magnification by using a TEM. At this time, the magnification is preferably adjusted such that at least 20 crystal grains are included in the observation field. Next, with respect to randomly selected 10 crystal grains in the observation field, the maximum diameter of one crystal grain is defined as a grain size of this crystal grain. Of the grain sizes of the respective crystal grains thus obtained, an arithmetic average value of the grain sizes excluding the maximum value and the minimum value is defined as "average grain size of the nanoparticles".

In the aforementioned equation, a ratio between $(Al_aCr_bTi_{1-a-b})$ and N is not particularly limited and can be an arbitrary ratio. For example, if the former is 1, the latter (i.e., N) can be 0.8 to 1.1.

As described above, the adhesion-resistant layer of the present invention achieves very excellent adhesion resistance, which is one of the features of the present invention.

The aforementioned adhesion-resistant layer preferably has a thickness of 0.5 to 8 μm, and more preferably 0.8 to 5 μm. If the thickness of the adhesion-resistant layer is smaller than 0.5 μm, the adhesion-resistant layer does not achieve sufficient adhesion resistance in some cases. If the thickness exceeds 8 μm, the wear resistance may be reduced.

<Wear-Resistant Layer>

The wear-resistant layer of the present invention is located between the base material and the aforementioned adhesion-resistant layer, and has a function of improving the wear resistance.

The aforementioned wear-resistant layer needs to have a multilayer structure in which an A layer of a nitride containing Ti and Al as well as a B layer of a nitride containing Al and Cr are alternately stacked, and to have a cubic crystal structure.

Since the layer of a nitride containing Al and Cr has a property of being excellent in wear resistance and heat resistance, use of this layer as the wear-resistant layer is conceivable. This layer, however, has a disadvantage of being hard and brittle. Thus, in the present invention, the layers of a nitride containing Ti and Al, which are known as being excellent in toughness, as well as the layers of a nitride containing Al and Cr are alternately stacked, and thereby, the present invention succeeded in not only improving the wear resistance but also achieving the heat resistance and the toughness.

In addition, the wear-resistant layer of the present invention contains Ti accordingly, and thus, the wear-resistant layer also contributes to suppressing chemical wear of a flank face during high-speed processing.

Furthermore, the wear-resistant layer of the present invention has a cubic crystal structure, and thus, the hardness is improved and very excellent wear resistance is achieved in combination with the aforementioned composition. The wear-resistant layer of the present invention preferably has a structure of columnar crystals and an average grain size of the columnar crystals is larger than 150 nm and equal to or smaller than 250 nm. By strengthening the grain boundary, the hardness is improved and the wear resistance is improved.

In this specification, "average grain size of the columnar crystals" is measured as follows. First, the coating film is cut and a cross section is observed at 20000 to 1000000-fold magnification by using the TEM. At this time, the magnification is preferably adjusted such that at least 20 crystal grains (columnar crystals) are included in the observation field. Next, with respect to randomly selected 10 columnar crystals in the observation field, the maximum width (maximum diameter) of the widths (diameters) perpendicular to the extension direction of the columnar crystals is measured. Of the measurement values thus obtained, an arithmetic average value of the measurement values excluding the maximum value and the minimum value is defined as "average grain size of the columnar crystals".

Now, assuming that Ta represents an average thickness of the aforementioned A layer and Tb represents an average thickness of the aforementioned B layer, a thickness ratio Tb/Ta preferably satisfies a relationship of $1.5 \leq Tb/Ta \leq 4$, and more preferably $2 \leq Tb/Ta \leq 3$. The thickness ratio is set within the aforementioned range to thereby achieve sufficient wear resistance and heat resistance due to the B layer and also to sufficiently achieve the effect of improving the toughness due to the A layer.

If the aforementioned thickness ratio is lower than 1.5, the wear resistance may be reduced. If the aforementioned thickness ratio exceeds 4, the toughness may be worsened and the wear resistance of the flank face during high-speed processing of the high-hardness workpiece material may be reduced.

The aforementioned average thickness refers to a thickness obtained by dividing a total thickness of the respective layers by the number of stacked layers.

Average thickness Ta of the aforementioned A layer is preferably 1 to 10 nm, and more preferably 2 to 6 nm. Average thickness Tb of the aforementioned B layer is preferably 1.5 to 30 nm, and more preferably 7 to 20 nm. Each layer has the aforementioned thickness, and thereby, particularly excellent toughness and wear resistance can be obtained. If the thickness of each layer is smaller than the aforementioned lower limit value, the effect produced by multilayer stacking is not obtained. If the thickness of each layer exceeds the upper limit value, the effect produced by multilayer stacking is not obtained, either.

The aforementioned thickness of the wear-resistant layer is preferably obtained by alternately stacking 100 to 10000 layers of the aforementioned A layers and 100 to 10000 layers of the aforementioned B layers. As a result, particularly high toughness is achieved.

On the other hand, the aforementioned A layer is preferably composed of a nitride expressed by $(Ti_{1-c}Al_c)N$ (wherein $0.3 < c \leq 0.7$), and the aforementioned B layer is preferably composed of a nitride expressed by $(Al_e Cr_{1-e})N$ (wherein $0.6 < e < 0.75$). The A layer and the B layer have the aforementioned compositions, and thereby, the A layer can be configured to be particularly excellent in toughness and have a high hardness, and the B layer can be configured to be particularly excellent in heat resistance. These layers are alternately stacked, and thereby, particularly excellent wear resistance can be achieved.

In the aforementioned $(Ti_{1-c}Al_c)N$, a ratio between $(Ti_{1-c}Al_c)$ and N is not particularly limited and can be an arbitrary ratio. For example, if the former is 1, the latter (i.e., N) can be 0.8 to 1.1. Similarly, in the aforementioned $(Al_e Cr_{1-e})N$, a ratio between $(Al_e Cr_{1-e})$ and N is not particularly limited, either, and can be an arbitrary ratio. For example, if the former is 1, the latter (i.e., N) can be 0.8 to 1.1.

As long as the aforementioned A layer and B layer are alternately stacked, the order of stacking is not particularly limited. In other words, the A layer may be located on the base material side (the stacking start side), or the B layer may be located on the base material side. Alternatively, the A layer may be located on the adhesion-resistant layer side (the stacking end side), or the B layer may be located on the adhesion-resistant layer side. It is assumed that stacking starts with the A layer and ends with the B layer, unless otherwise noted.

<Hardness Ratio>

As for the hardness of the coating film, assuming that H1 represents a hardness of the wear-resistant layer and H2 represents a hardness measured from a surface of the adhesion-resistant layer, a hardness ratio H2/H1 preferably satisfies a relationship of $0.7 < H2/H1 < 1.1$, and more preferably $0.9 < H2/H1 < 1.0$.

As described above, the adhesion-resistant layer of the present invention is characterized by the hardness improved as compared with MN having a hexagonal crystal structure. On the other hand, the adhesion-resistant layer of the present invention is lower in hardness than the wear-resistant layer, and thereby, smooth wear is achieved and chip dischargeability becomes better at a portion where wear progresses. As a result, the cutting resistance can be reduced, and chipping and breakage of the tool can be suppressed. If the adhesion-resistant layer of the present invention is higher in hardness than the wear-resistant layer, the sustention of the adhesion-resistant layer is improved, and thus, excellent adhesion resistance is obtained.

In other words, the adhesion-resistant layer and the wear-resistant layer of the present invention are significantly different from each other in properties such as hardness, heat resistance and slidability because they are different from each other in crystal structure. However, the adhesion-resistant layer and the wear-resistant layer of the present invention are comparatively similar to each other in chemical composition, and thus, they are similar to each other in chemical reactivity and therefore in chemical wear tendency. Therefore, by setting the hardness ratio within the aforementioned range, a balance of hardness between both layers is optimized and the stable wear property is obtained, which is presumed to lead to suppression of chipping and breakage of the tool.

<Thickness Ratio T2/T1>

Assuming that T1 represents a thickness of the aforementioned wear-resistant layer and T2 represents a thickness of the aforementioned adhesion-resistant layer, a thickness ratio T2/T1 preferably satisfies a relationship of $0.17 \leq T2/T1 \leq 0.55$. In other words, the thickness of the adhesion-resistant layer is preferably smaller than the thickness of the wear-resistant layer as described above.

If thickness ratio T2/T1 is lower than 0.17, sufficient adhesion resistance is not obtained in some cases. If thickness ratio T2/T1 exceeds 0.55, sufficient wear resistance is not obtained in some cases. By setting thickness ratio T2/T1 within the aforementioned range, a balance between smooth wear in the adhesion-resistant layer and a high degree of wear resistance in the wear-resistant layer can be optimized, and chipping and breakage of the tool can be highly suppressed.

<Intermediate Layer>

The coating film of the present invention can include an arbitrary layer in addition to the wear-resistant layer and the adhesion-resistant layer described above.

For example, the coating film of the present invention can have an intermediate layer between the base material and the wear-resistant layer. This intermediate layer is preferably composed of a nitride containing Ti and Al and has a thickness of 0.01 to 0.5 µm.

The aforementioned intermediate layer is formed, and thereby, the adhesiveness between the base material and the coating film is improved and peeloff of the coating film from the base material during cutting work can be effectively prevented. If the thickness of the intermediate layer is smaller than 0.01 µm, sufficient adhesiveness is not obtained in some cases. If the thickness of the intermediate layer exceeds 0.5 µm, the intermediate layer is inferior in toughness to the wear-resistant layer, and thus, the adhesive layer itself may be destroyed, which may lead to peeloff of the coating film. More preferable thickness of the aforementioned intermediate layer is 0.05 to 0.3 µm.

The specific composition of the nitride containing Ti and Al that forms the intermediate layer is not particularly limited, and a conventionally known composition can be arbitrarily selected.

<Adherent Layer>

The coating film of the present invention can further have a first adherent layer and a second adherent layer between the wear-resistant layer and the adhesion-resistant layer.

The first adherent layer can be configured to be located between the wear-resistant layer and the second adherent layer, to be composed of a nitride containing Ti and Al, and to have a thickness of 30 nm to 0.1 µm. The second adherent layer can be configured to have a multilayer structure in which a C layer being of a nitride containing Ti and Al and having the same crystal structure as that of the wear-resistant layer as well as a D layer having the same composition as that of the adhesion-resistant layer are alternately stacked, and to have a thickness of 10 nm to 0.2 µm.

Since the wear-resistant layer and the adhesion-resistant layer of the present invention are different from each other in crystal structure, the wear-resistant layer and the adhesion-resistant layer of the present invention may be inferior in adhesiveness, and sufficient adhesion resistance cannot be obtained in some cases due to easy peeloff of the adhesion-resistant layer, and the like. Thus, it is preferable to form, between the wear-resistant layer and the adhesion-resistant layer, the second adherent layer formed by alternately stacking the C layer being of a nitride containing Ti and Al and having the same crystal structure as that of the wear-resistant layer as well as the D layer having the same composition as that of the adhesion-resistant layer and thus having the same crystal structure as that of the adhesion-resistant layer. As a result, the adhesiveness between the wear-resistant layer and the adhesion-resistant layer can be dramatically improved.

The aforementioned second adherent layer is preferably formed by repeating alternate stacking of the C layer and the D layer twice to ten times, and has a thickness of 10 nm to 0.2 µm. Stacking is repeated twice or more, and thereby, the mechanical properties are improved and the adhesiveness is improved. The second adherent layer preferably has a thickness of 0.2 µm or smaller. This is because, if the thickness exceeds 0.2 µm, the mechanical properties are reduced and self-destruction occurs easily. Therefore, in consideration of the thickness, the upper limit of the number of repetition of stacking is preferably approximately 10.

As long as the aforementioned C layer and D layer are alternately stacked, the order of stacking is not particularly limited. In other words, the C layer may be located on the wear-resistant layer side (the stacking start side), or the D layer may be located on the wear-resistant layer side. Alternatively, the C layer may be located on the adhesion-resistant layer side (the stacking end side), or the D layer may be located on the adhesion-resistant layer side. However, in consideration of the adhesiveness to the wear-resistant layer, it is preferable that stacking starts with the C layer. Therefore, it is assumed that stacking starts with the C layer and ends with the D layer, unless otherwise noted.

Furthermore, the first adherent layer is formed between this second adherent layer and the wear-resistant layer, and thereby the adhesiveness between the wear-resistant layer and the adhesion-resistant layer can be further improved. Since the wear-resistant layer has a high hardness as described above, the wear-resistant layer tends to be inferior in adhesiveness to the other layers. Therefore, the first adherent layer composed of a nitride containing Ti and Al and having particularly excellent adhesiveness to the other layers is interposed, and thereby, the adhesiveness between the wear-resistant layer and the second adherent layer is improved, and thus, the adhesiveness between the wear-resistant layer and the adhesion-resistant layer is further improved. Preferably, the nitride containing Ti and Al that forms the first adherent layer has a cubic crystal structure that is the same as that of the wear-resistant layer.

The aforementioned first adherent layer preferably has a thickness of 30 nm to 0.1 µm. If the thickness of the first adherent layer exceeds 0.1 the mechanical strength is reduced. If the thickness of the first adherent layer is smaller than 30 nm, the first adherent layer does not have sufficient adhesiveness. The specific composition of the nitride containing Ti and Al that forms the first adherent layer is not particularly limited, and a conventionally known composition can be arbitrarily selected.

<Atomic Ratio>

Preferably, in the whole of the coating film of the present invention, an atomic ratio of Al to all metal atoms (i.e., an atomic ratio of Al when it is assumed that the number of all metal atoms is 1) is higher than 0.6 and equal to or lower than 0.8, and an atomic ratio of Cr to all metal atoms is higher than 0.15 and equal to or lower than 0.3.

The atomic ratio of Al is set within the aforementioned range as the average composition of the entire coating film, and thereby, the coating film having excellent adhesion resistance and excellent heat resistance can be obtained. More preferably, the atomic ratio of Al is higher than 0.65 and equal to or lower than 0.72.

On the other hand, the atomic ratio of Cr is set within the aforementioned range as the average composition of the entire coating film, and thereby, the coating film having excellent wear resistance can be obtained. More preferably, the atomic ratio of Cr is higher than 0.17 and equal to or lower than 0.23.

As described above, the atomic ratios of Al and Cr are set within the aforementioned ranges as the average composition of the entire coating film, and thereby, the wear resistance and the adhesion resistance of the coating film can be highly improved.

In the present invention, "metal atom" refers to an atom of an element other than hydrogen, helium, neon, argon, krypton, xenon, radon, fluorine, chlorine, bromine, iodine, astatine, oxygen, sulfur, selenium, tellurium, nitrogen, phosphorus, arsenic, antimony, and carbon.

<Stress>

The stress of the coating film of the present invention is measured as follows. First, an amount of warpage of a plate made of cemented carbide (20 mm×10 mm×1 mm) before and after film formation is measured by using a surface roughness meter. Next, a film thickness of the coating film is measured by using Calotest. Then, by using the amount of warpage and the film thickness thus obtained, the stress of the coating film is calculated.

The coating film of the present invention preferably has a compressive stress of −0.1 GPa or less and −3.0 GPa or more, and more preferably −1.0 GPa or less and −2.5 GPa or more.

The coating film of the present invention has the aforementioned compressive stress, and thereby, progress of a crack that is considered to be a cause of chipping can be suppressed. In other words, the coating film of the present invention has excellent chipping resistance.

<X-Ray Pattern>

An X-ray diffraction pattern described in this specification is measured under the following conditions:
  measurement site: a flank face of a drill
  used X-ray: Cu-Kα
  excitation condition: 45 kV 200 mA
  used collimator: φ0.3 mm
  measurement method: θ-2θ method.

In addition, in this specification, a peak strength is measured as follows. First, with respect to the obtained X-ray diffraction pattern, peak positions are specified at 2θ=36°, 37.4°, 37.9°, and 43.2°. Next, peak separation is automatically made by using software. The strengths of the separated peaks are thus obtained.

The coating film of the present invention can have the following X-ray diffraction pattern. Specifically, assuming that K1 represents a peak strength near 2θ=36° and K2 represents a peak strength near 2θ=37.4°, a strength ratio K2/K1 satisfies a relationship of 0.2<K2/K1<0.35. The peak near 2θ=36° corresponds to the hexagonal crystal (002) in the adhesion-resistant layer and the peak near 2θ=37.4° corresponds to the cubic crystal (111) in the wear-resistant layer. In other words, in this case, the adhesion-resistant layer has (002) orientation and the wear-resistant layer has (111) orientation. The (002) face of the hexagonal crystal and the (111) face of the cubic crystal are the densest face and are also the face having the highest strength in the respective layers. Therefore, due to the aforementioned X-ray diffraction pattern of the coating film of the present invention, the sustention of the adhesion-resistant layer and the wear resistance of the wear-resistant layer become more excellent.

The coating film of the present invention can also have the following X-ray diffraction pattern. Specifically, assuming that K1 represents a peak strength near 2θ=37.4° and K2 represents a peak strength near 2θ=37.9°, a strength ratio K2/K1 satisfies a relationship of 0.4<K2/K1<0.6. The peak near 2θ=37.4° corresponds to the cubic crystal (111) in the wear-resistant layer and the peak near 2θ=37.9° corresponds to the hexagonal crystal (101) in the adhesion-resistant layer. In other words, in this case, the adhesion-resistant layer has (101) orientation and the wear-resistant layer has (111) orientation. The (111) face of the cubic crystal is the densest face and is also the face having the highest strength. The (101) face of the hexagonal crystal seems to be lower in strength than the densest face. Due to the aforementioned X-ray diffraction pattern of the coating film of the present invention, the wear resistance of the wear-resistant layer can become more excellent, and smooth wear can be achieved and chip dischargeability can become better at a portion of the adhesion-resistant layer where wear progresses. As a result, the cutting resistance can be reduced, and chipping and breakage of the tool can be suppressed.

The coating film of the present invention can also have the following X-ray diffraction pattern. Specifically, assuming that K1 represents a peak strength near 2θ=37.4° and K2 represents a peak strength near 2θ=43.2°, a strength ratio K2/K1 satisfies a relationship of 0.6<K2/K1<0.75. The peak near 2θ=37.4° corresponds to the cubic crystal (111) in the wear-resistant layer and the peak near 2θ=43.2° corresponds to the cubic crystal (200) in the adhesion-resistant layer. In this case, the wear-resistant layer has weak (111) orientation. The (111) face of the cubic crystal is the densest face and is also the face having the highest strength. Therefore, due to the aforementioned X-ray diffraction pattern of the coating film of the present invention, the wear resistance of the wear-resistant layer becomes more excellent.

<Manufacturing Method>

The surface-coated cutting tool according to the present invention can be manufactured by forming the coating film on the base material by using, for example, a physical vapor deposition method. A conventionally known method can be used without particular limitation as the physical vapor deposition method, and at least one type of method selected from the group consisting of an arc ion plating method, a balanced magnetron sputtering method and an unbalanced magnetron sputtering method can be used, for example.

EXAMPLES

The present invention will be described in more detail hereinafter based on examples, although the present invention is not limited thereto. The composition of each layer of the coating film in each example described below can be specified by EDS analysis (energy dispersive X-ray analysis) included with a transmission electron microscope.

Examples 1 to 12 and Comparative Examples 1 to 5

The surface-coated cutting tools in Examples 1 to 12 and Comparative Examples 1 to 5 were fabricated as follows. Each of these surface-coated cutting tools had such a configuration that the intermediate layer, the wear-resistant layer, the first adherent layer, the second adherent layer, and the adhesion-resistant layer were formed in this order as the coating film on the base material by the arc ion plating method, and the remaining configuration except for the second adherent layer and the adhesion-resistant layer was common.

A drill (blade diameter: diameter of 8.0 mm, overall length: 115 mm, groove length: 65 mm, with an oil hole) made of cemented carbide was used as the base material.

This base material was placed at an arc ion plating device, evacuation was performed, and the base material was heated to 500° C. Thereafter, Ar ion etching was performed, and then, the intermediate layer (thickness: 0.2 μm) composed of a nitride containing Ti and Al was first formed on the base material by arc deposition in the $N_2$ gas atmosphere. The nitride containing Ti and Al had a composition of $Ti_{0.5}Al_{0.5}N$ and the formation conditions were as follows:

target: $Ti_{0.5}Al_{0.5}$ pressure: 6 Pa arc current: 120 A bias voltage: 50 V.

In the case of forming each layer by using the arc ion plating method, the composition of the used target was adjusted to achieve the composition of each layer.

Next, the wear-resistant layer (thickness: 3.9 μm) having the multilayer structure including the alternately stacked A layers and B layers was formed on the intermediate layer formed as above. The A layer of a nitride containing Ti and Al had a thickness (Ta) of 4 nm and a composition of $Ti_{0.5}Al_{0.5}N$. The B layer of a nitride containing Al and Cr had a thickness (Tb) of 10 nm and a composition of $Al_{0.65}Cr_{0.35}N$. The number of stacking of each of the A layers and the B layers was 280 and Tb/Ta=2.5. The formation conditions for this wear-resistant layer were as follows:

target: $Ti_{0.5}Al_{0.5}$ (A layer), $Al_{0.65}Cr_{0.35}$ (B layer)

pressure: 5 Pa discharge current: 100 A (A layer), 180 A (B layer)

bias voltage: 40 V.

The aforementioned targets were placed at a prescribed position in a furnace of the arc ion plating device, and the base material was rotated with the base material facing each target. While adjusting the rotation speed, the wear-resistant layer having the multilayer structure including the alternately stacked A layers and B layers was formed.

The crystal structure of this wear-resistant layer was measured by using an X-ray diffraction device, and it was confirmed that the wear-resistant layer had a cubic crystal structure.

Subsequently, the first adherent layer (thickness: 30 nm) composed of a nitride containing Ti and Al was formed on the wear-resistant layer formed as above. The nitride containing Ti and Al had a composition of $Ti_{0.5}Al_{0.5}N$ and the formation conditions were as follows:

target: $Ti_{0.5}Al_{0.5}$ discharge current: 100 A bias voltage: 100 V.

Subsequently, the second adherent layer (thickness: 60 nm) having the multilayer structure including the alternately stacked C layers and D layers was formed on the first adherent layer formed as above. The C layer of a nitride containing Ti and Al had a thickness of 6 nm and a composition of $Ti_{0.5}Al_{0.5}N$. The D layer had a thickness of 6 nm and the same composition as that of the adhesion-resistant layer described in Table 1 below. The number of stacking of each of the C layers and the D layers was 5. The formation conditions for this second adherent layer were as follows:

target: $Ti_{0.5}Al_{0.5}$ (C layer), the same target as that of the adhesion-resistant layer described in Table 1 (D layer)

discharge current: 100 A (C layer), 100 A (D layer)

bias voltage: 100 V.

Similarly to the aforementioned formation of the wear-resistant layer, the base material was rotated with the base material facing each target. While adjusting the rotation speed, the second adherent layer having the aforementioned configuration was formed.

The crystal structure of this second adherent layer was measured by using transmission electron diffraction (TED) included with the transmission electron microscope, and it was confirmed that the C layer had a cubic crystal structure and the D layer had a wurtzite-type crystal structure.

Next, the adhesion-resistant layer (thickness (T2): 1.5 μm, which was common) was formed on the second adherent layer formed as above. This adhesion-resistant layer was located at the outermost surface of the coating film and had a composition described in Table 1 below. The formation conditions were as follows:

target: target having the composition adjusted to the composition described in Table 1 discharge current: 150 A bias voltage: 100 V.

The crystal structure of the adhesion-resistant layer thus formed was measured by using the X-ray diffraction device, and it was confirmed that the adhesion-resistant layer had a wurtzite-type crystal structure except for Comparative Examples 2 and 3. The adhesion-resistant layer in each of Comparative Examples 2 and 3 had a cubic crystal structure.

Ratio T2/T1 between thickness T1 of the wear-resistant layer and thickness T2 of the adhesion-resistant layer is shown in Table 1.

TABLE 1

|  | composition of adhesion-resistant layer | thickness ratio T2/T1 |
|---|---|---|
| Example 1 | $Al_{0.82}Cr_{0.15}Ti_{0.03}N$ | 0.38 |
| Example 2 | $Al_{0.82}Cr_{0.14}Ti_{0.04}N$ | 0.38 |
| Example 3 | $Al_{0.81}Cr_{0.1}Ti_{0.09}N$ | 0.38 |
| Example 4 | $Al_{0.80}Cr_{0.05}Ti_{0.15}N$ | 0.38 |
| Example 5 | $Al_{0.80}Cr_{0.02}Ti_{0.18}N$ | 0.38 |
| Example 6 | $Al_{0.85}Cr_{0.1}Ti_{0.05}N$ | 0.38 |
| Example 7 | $Al_{0.86}Cr_{0.07}Ti_{0.07}N$ | 0.38 |
| Example 8 | $Al_{0.85}Cr_{0.03}Ti_{0.12}N$ | 0.38 |
| Example 9 | $Al_{0.90}Cr_{0.06}Ti_{0.04}N$ | 0.38 |
| Example 10 | $Al_{0.79}Cr_{0.17}Ti_{0.04}N$ | 0.38 |
| Example 11 | $Al_{0.75}Cr_{0.1}Ti_{0.15}N$ | 0.38 |
| Example 12 | $Al_{0.80}Cr_{0.15}Ti_{0.05}N$ | 0.38 |
| Comparative Example 1 | AlN | 0.38 |
| Comparative Example 2 | $Al_{0.72}Cr_{0.23}Ti_{0.05}N$ | 0.38 |
| Comparative Example 3 | $Al_{0.65}Cr_{0.1}Ti_{0.25}N$ | 0.38 |
| Comparative Example 4 | $Al_{0.75}Ti_{0.25}N$ | 0.38 |
| Comparative Example 5 | $Al_{0.85}Cr_{0.15}N$ | 0.38 |

The surface-coated cutting tool having the coating film formed on the base material as described above was cooled, and then, the surface-coated cutting tool was taken out from the arc ion plating device, and then, the surface of the coating film was smoothed with a brush containing abrasive grains. The surface-coated cutting tools in Examples 1 to 12 and Comparative Examples 1 to 5 were thus obtained.

Comparative Examples 6 to 10

The surface-coated cutting tools were fabricated in completely the same manner as in Example 6 described above, except that the wear-resistant layer had a configuration described in Table 2 below (the adhesion-resistant layer in Comparative Example 10, however, had a composition of $Ti_{0.5}Al_{0.5}N$ (thickness: 2 μm) instead of the configuration of the adhesion-resistant layer in Example 6). The wear-resistant layer in each of these Comparative Examples had a cubic crystal structure.

TABLE 2

| | wear-resistant layer | | | | thickness ratio Tb/Ta | number of stacking | thickness T1 (μm) | thickness ratio T2/T1 |
| --- | --- | --- | --- | --- | --- | --- | --- | --- |
| | A layer | | B layer | | | | | |
| | composition | thickness Ta | composition | thickness Tb | | | | |
| Comparative Example 6 | single layer of $Ti_{0.15}Al_{0.65}Cr_{0.2}N$ | | | | — | — | 4 | 0.38 |
| Comparative Example 7 | $Ti_{0.5}Cr_{0.5}N$ | 7 nm | $Al_{0.7}Cr_{0.3}N$ | 10 nm | 1.4 | 250 | 4.3 | 0.35 |
| Comparative Example 8 | $Ti_{0.8}Si_{0.2}N$ | 5 nm | $Al_{0.7}Ti_{0.3}N$ | 7 nm | 1.4 | 300 | 3.6 | 0.42 |
| Comparative Example 9 | single layer of $Al_{0.7}Cr_{0.3}N$ | | | | — | — | 4.0 | 0.38 |
| Comparative Example 10 | $Ti_{0.5}Al_{0.5}N$ | 4 nm | $Al_{0.65}Cr_{0.35}N$ | 10 nm | 2.5 | 280 | 3.9 | — |

Examples 13 to 16

The surface-coated cutting tools in Examples 13 to 16 were fabricated as follows. Each of these surface-coated cutting tools had such a configuration that the wear-resistant layer, the first adherent layer, the second adherent layer, and the adhesion-resistant layer were formed in this order as the coating film on the base material by the arc ion plating method, and the remaining configuration except for the wear-resistant layer was common.

The base material was the same as that in Examples 1 to 12 described above.

This base material was placed at the arc ion plating device, and the wear-resistant layer having the multilayer structure including the alternately stacked A layers and B layers was formed. The specific configuration of the wear-resistant layer is as described in Table 3 below and the formation conditions were the same as those in Examples 1 to 12 described above.

TABLE 3

| | wear-resistant layer | | | | thickness ratio Tb/Ta | number of stacking | thickness T1 (μm) | thickness ratio T2/T1 |
| --- | --- | --- | --- | --- | --- | --- | --- | --- |
| | A layer | | B layer | | | | | |
| | composition | thickness Ta | composition | thickness Tb | | | | |
| Example 13 | $Ti_{0.3}Al_{0.7}N$ | 10 nm | $Al_{0.6}Cr_{0.4}N$ | 30 nm | 3.0 | 80 | 3.2 | 0.47 |
| Example 14 | $Ti_{0.3}Al_{0.7}N$ | 8 nm | $Al_{0.6}Cr_{0.4}N$ | 20 nm | 2.5 | 120 | 3.4 | 0.45 |
| Example 15 | $Ti_{0.3}Al_{0.7}N$ | 5 nm | $Al_{0.6}Cr_{0.4}N$ | 11 nm | 2.2 | 250 | 4.0 | 0.38 |
| Example 16 | $Ti_{0.3}Al_{0.7}N$ | 3.1 nm | $Al_{0.6}Cr_{0.4}N$ | 4.8 nm | 1.5 | 500 | 4.0 | 0.38 |

The crystal structure of this wear-resistant layer was measured by using the X-ray diffraction device, and it was confirmed that the wear-resistant layer had a cubic crystal structure.

Subsequently, the first adherent layer (thickness: 50 nm) composed of a nitride containing Ti and Al was formed on the wear-resistant layer formed as above. The nitride containing Ti and Al had a composition of $Ti_{0.3}Al_{0.7}N$ and the formation conditions were the same as those in Examples 1 to 12 described above, except for the composition of the target.

Subsequently, the second adherent layer (thickness: 60 nm) having the multilayer structure including the alternately stacked C layers and D layers was formed on the first adherent layer formed as above. The C layer of a nitride containing Ti and Al had a thickness of 6 nm and a composition of $Ti_{0.3}Al_{0.7}N$. The D layer had a thickness of 6 nm and the same composition as that of the adhesion-resistant layer described below. The number of stacking of each of the C layers and the D layers was 5. The formation conditions for this second adherent layer were the same as those in Examples 1 to 12 described above, except for the composition of the target.

The crystal structure of this second adherent layer was measured by using transmission electron diffraction (TED) included with the transmission electron microscope, and it was confirmed that the C layer had a cubic crystal structure and the D layer had a wurtzite-type crystal structure.

Next, the adhesion-resistant layer (thickness (T2): 1.5 μm, which was common) was formed on the second adherent layer formed as above. This adhesion-resistant layer was located at the outermost surface of the coating film and had a composition of $Al_{0.84}Cr_{0.1}Ti_{0.06}N$. The formation conditions were the same as those in Examples 1 to 12 described above, except for the composition of the target.

The crystal structure of the adhesion-resistant layer thus formed was measured by using the X-ray diffraction device, and it was confirmed that the adhesion-resistant layer had a wurtzite-type crystal structure.

Ratio T2/T1 between thickness T1 of the wear-resistant layer and thickness T2 of the adhesion-resistant layer is shown in Table 3.

The surface-coated cutting tool having the coating film formed on the base material as described above was cooled, and then, the surface-coated cutting tool was taken out from the arc ion plating device, and then, the surface of the coating film was smoothed with the brush containing abrasive grains. The surface-coated cutting tools in Examples 13 to 16 were thus obtained.

Examples 17 to 24

The surface-coated cutting tools in Examples 17 to 24 were fabricated as follows. Each of these surface-coated cutting tools had such a configuration that the intermediate layer, the wear-resistant layer, the first adherent layer, the second adherent layer, and the adhesion-resistant layer were formed in this order as the coating film on the base material by the arc ion plating method, and the remaining configuration except for the thickness of the wear-resistant layer and the thickness of the adhesion-resistant layer was common.

The base material was the same as that in Examples 1 to 12 described above.

This base material was placed at the arc ion plating device, and the intermediate layer (thickness: 0.3 μm) composed of a nitride containing Ti and Al was first formed on the base material. The nitride containing Ti and Al had a composition of $Ti_{0.5}Al_{0.5}N$ and the formation conditions were the same as those in Examples 1 to 12 described above.

Next, the wear-resistant layer (thickness is as shown in Table 4 below) having the multilayer structure including the alternately stacked A layers and B layers was formed on the intermediate layer formed as above. The A layer of a nitride containing Ti and Al had a thickness (Ta) of 4 nm and a composition of $Ti_{0.5}Al_{0.5}N$. The B layer of a nitride containing Al and Cr had a thickness (Tb) of 10 nm and a composition of $Al_{0.7}Cr_{0.3}N$. The number of stacking of each of the A layers and the B layers is as shown in Table 4 below and Tb/Ta=2.5. The formation conditions for this wear-resistant layer were the same as those in Examples 1 to 12 described above.

The crystal structure of this wear-resistant layer was measured by using the X-ray diffraction device, and it was confirmed that the wear-resistant layer had a cubic crystal structure.

Subsequently, the first adherent layer (thickness: 30 nm) composed of a nitride containing Ti and Al was formed on the wear-resistant layer formed as above. The nitride containing Ti and Al had a composition of $Ti_{0.5}Al_{0.5}N$ and the formation conditions were the same as those in Examples 1 to 12 described above.

Subsequently, the second adherent layer (thickness: 30 nm) having the multilayer structure including the alternately stacked C layers and D layers was formed on the first adherent layer formed as above. The C layer of a nitride containing Ti and Al had a thickness of 6 nm and a composition of $Ti_{0.5}Al_{0.5}N$. The D layer had a thickness of 9 nm and the same composition as that of the adhesion-resistant layer described below. The number of stacking of each of the C layers and the D layers was 2. The formation conditions for this second adherent layer were the same as those in Examples 1 to 12 described above.

The crystal structure of this second adherent layer was measured by using transmission electron diffraction (TED) included with the transmission electron microscope, and it was confirmed that the C layer had a cubic crystal structure and the D layer had a wurtzite-type crystal structure.

Next, the adhesion-resistant layer (thickness (T2) is as shown in Table 4 below) was formed on the second adherent layer formed as above. This adhesion-resistant layer was located at the outermost surface of the coating film and had a composition of $Al_{0.85}Cr_{0.1}Ti_{0.05}N$. The formation conditions were the same as those in Examples 1 to 12 described above.

The crystal structure of the adhesion-resistant layer thus formed was measured by using the X-ray diffraction device, and it was confirmed that the adhesion-resistant layer had a wurtzite-type crystal structure.

Ratio T2/T1 between thickness T1 of the wear-resistant layer and thickness T2 of the adhesion-resistant layer is shown in Table 4.

TABLE 4

| | thickness of wear-resistant layer (μm) | number of stacking of wear-resistant layer | thickness of adhesion-resistant layer (μm) | thickness ratio T2/T1 |
|---|---|---|---|---|
| Example 17 | 1.0 | 74 | 0.4 | 0.4 |
| Example 18 | 1.6 | 112 | 0.6 | 0.38 |
| Example 19 | 2.9 | 205 | 1.1 | 0.38 |
| Example 20 | 5.2 | 373 | 2 | 0.38 |
| Example 21 | 7.8 | 560 | 3 | 0.38 |
| Example 22 | 13.1 | 933 | 5 | 0.38 |
| Example 23 | 19.6 | 1400 | 7.5 | 0.38 |
| Example 24 | 26.1 | 1866 | 10 | 0.38 |

The surface-coated cutting tool having the coating film formed on the base material as described above was cooled, and then, the surface-coated cutting tool was taken out from the arc ion plating device, and then, the surface of the coating film was smoothed with the brush containing abrasive grains. The surface-coated cutting tools in Examples 17 to 24 were thus obtained.

Examples 25 to 30

The surface-coated cutting tools in Examples 25 to 30 were fabricated as follows. Each of these surface-coated cutting tools had such a configuration that the intermediate layer, the wear-resistant layer, the first adherent layer, the second adherent layer, and the adhesion-resistant layer were formed in this order as the coating film on the base material by the arc ion plating method, and the remaining configuration except for the thickness of the wear-resistant layer and the thickness of the adhesion-resistant layer was common.

The base material was the same as that in Examples 1 to 12 described above.

This base material was placed at the arc ion plating device, and the intermediate layer (thickness: 0.1 μm) composed of a nitride containing Ti and Al was first formed on the base material. The nitride containing Ti and Al had a composition of $Ti_{0.7}Al_{0.3}N$ and the formation conditions were the same as those in Examples 1 to 12 described above.

Next, the wear-resistant layer (thickness is as shown in Table 5 below) having the multilayer structure including the alternately stacked A layers and B layers was formed on the intermediate layer formed as above. The A layer of a nitride containing Ti and Al had a thickness (Ta) of 5 nm and a composition of $Ti_{0.7}Al_{0.3}N$. The B layer of a nitride containing Al and Cr had a thickness (Tb) of 19 nm and a composition of $Al_{0.67}Cr_{0.33}N$. The number of stacking of each of the A layers and the B layers is as shown in Table 5 below and Tb/Ta=3.8. The formation conditions for this wear-resistant layer were the same as those in Examples 1 to 12 described above.

The crystal structure of this wear-resistant layer was measured by using the X-ray diffraction device, and it was confirmed that the wear-resistant layer had a cubic crystal structure.

Subsequently, the first adherent layer (thickness: 70 nm) composed of a nitride containing Ti and Al was formed on the wear-resistant layer formed as above. The nitride containing Ti and Al had a composition of $Ti_{0.33}Al_{0.67}N$ and the formation conditions were the same as those in Examples 1 to 12 described above.

Subsequently, the second adherent layer (thickness: 70 nm) having the multilayer structure including the alternately stacked C layers and D layers was formed on the first adherent layer formed as above. The C layer of a nitride containing Ti and Al had a thickness of 5 nm and a composition of $Ti_{0.33}Al_{0.67}N$. The D layer had a thickness of 5 nm and the same composition as that of the adhesion-resistant layer described below. The number of stacking of each of the C layers and the D layers was 7. The formation conditions for this second adherent layer were the same as those in Examples 1 to 12 described above.

The crystal structure of this second adherent layer was measured by using transmission electron diffraction (TED) included with the transmission electron microscope, and it was confirmed that the C layer had a cubic crystal structure and the D layer had a wurtzite-type crystal structure.

Next, the adhesion-resistant layer (thickness (T2) is as shown in Table 5 below) was formed on the second adherent layer formed as above. This adhesion-resistant layer was located at the outermost surface of the coating film and had a composition of $Al_{0.85}Cr_{0.1}Ti_{0.05}N$. The formation conditions were the same as those in Examples 1 to 12 described above.

The crystal structure of the adhesion-resistant layer thus formed was measured by using the X-ray diffraction device, and it was confirmed that the adhesion-resistant layer had a wurtzite-type crystal structure.

Ratio T2/T1 between thickness T1 of the wear-resistant layer and thickness T2 of the adhesion-resistant layer is shown in Table 5.

TABLE 5

|  | thickness of wear-resistant layer (μm) | number of stacking of wear-resistant layer | thickness of adhesion-resistant layer (μm) | thickness ratio T2/T1 |
|---|---|---|---|---|
| Example 25 | 3.5 | 146 | 0.7 | 0.20 |
| Example 26 | 3.1 | 128 | 0.8 | 0.26 |
| Example 27 | 2.9 | 123 | 1 | 0.34 |
| Example 28 | 2.7 | 114 | 1.2 | 0.44 |
| Example 29 | 2.7 | 112 | 1.4 | 0.52 |
| Example 30 | 2.5 | 104 | 1.5 | 0.60 |

The surface-coated cutting tool having the coating film formed on the base material as described above was cooled, and then, the surface-coated cutting tool was taken out from the arc ion plating device, and then, the surface of the coating film was smoothed with the brush containing abrasive grains. The surface-coated cutting tools in Examples 25 to 30 were thus obtained.

Examples 31 to 37

The surface-coated cutting tools in Examples 31 to 37 were fabricated as follows. Each of these surface-coated cutting tools had such a configuration that the intermediate layer, the wear-resistant layer and the adhesion-resistant layer were formed in this order as the coating film on the base material by the arc ion plating method, and the remaining configuration except for the configuration of the wear-resistant layer was common.

The base material was the same as that in Examples 1 to 12 described above.

This base material was placed at the arc ion plating device, and the intermediate layer (thickness: 0.07 μm) composed of a nitride containing Ti and Al was first formed on the base material. The nitride containing Ti and Al had a composition of $Ti_{0.45}Al_{0.55}N$ and the formation conditions were the same as those in Examples 1 to 12 described above.

Next, the wear-resistant layer having the multilayer structure including the alternately stacked A layers and B layers was formed on the intermediate layer formed as above. The configuration of the wear-resistant layer is as shown in Table 6 below and the formation conditions were the same as those in Examples 1 to 12 described above.

The crystal structure of this wear-resistant layer was measured by using the X-ray diffraction device, and it was confirmed that the wear-resistant layer had a cubic crystal structure.

Subsequently, the adhesion-resistant layer (thickness (T2): 1.5 μm) was formed on the wear-resistant layer formed as above. This adhesion-resistant layer was located at the outermost surface of the coating film and had a composition of $Al_{0.85}Cr_{0.1}Ti_{0.05}N$. The formation conditions were the same as those in Examples 1 to 12 described above.

The crystal structure of the adhesion-resistant layer thus formed was measured by using the X-ray diffraction device, and it was confirmed that the adhesion-resistant layer had a wurtzite-type crystal structure.

Ratio T2/T1 between thickness T1 of the wear-resistant layer and thickness T2 of the adhesion-resistant layer is shown in Table 6.

TABLE 6

| | wear-resistant layer | | | | | | | |
|---|---|---|---|---|---|---|---|---|
| | A layer | | B layer | | thickness ratio Tb/Ta | number of stacking | thickness T1 (μm) | thickness ratio T2/T1 |
| | composition | thickness Ta | composition | thickness Tb | | | | |
| Example 31 | $Ti_{0.45}Al_{0.55}N$ | 0.7 nm | $Al_{0.65}Cr_{0.35}N$ | 0.6 nm | 0.9 | 2308 | 3 | 0.50 |
| Example 32 | $Ti_{0.45}Al_{0.55}N$ | 1.7 nm | $Al_{0.65}Cr_{0.35}N$ | 3.1 nm | 1.8 | 625 | 3 | 0.50 |
| Example 33 | $Ti_{0.45}Al_{0.55}N$ | 3.0 nm | $Al_{0.65}Cr_{0.35}N$ | 7 nm | 2.3 | 300 | 3 | 0.50 |
| Example 34 | $Ti_{0.45}Al_{0.55}N$ | 4.5 nm | $Al_{0.65}Cr_{0.35}N$ | 11 nm | 2.4 | 194 | 3 | 0.50 |
| Example 35 | $Ti_{0.45}Al_{0.55}N$ | 5.5 nm | $Al_{0.65}Cr_{0.35}N$ | 15 nm | 2.7 | 146 | 3 | 0.50 |
| Example 36 | $Ti_{0.45}Al_{0.55}N$ | 8.0 nm | $Al_{0.65}Cr_{0.35}N$ | 26 nm | 3.3 | 88 | 3 | 0.50 |
| Example 37 | $Ti_{0.45}Al_{0.55}N$ | 15.0 nm | $Al_{0.65}Cr_{0.35}N$ | 65 nm | 4.3 | 38 | 3 | 0.50 |

The surface-coated cutting tool having the coating film formed on the base material as described above was cooled, and then, the surface-coated cutting tool was taken out from the arc ion plating device, and then, the surface of the coating film was smoothed with the brush containing abrasive grains. The surface-coated cutting tools in Examples 31 to 37 were thus obtained.

Examples 38 to 43 and Comparative Examples 11 and 12

The surface-coated cutting tools in Examples 38 to 43 and Comparative Examples 11 and 12 were fabricated as follows.

Each of these surface-coated cutting tools had such a configuration that the intermediate layer, the wear-resistant layer, the first adherent layer, the second adherent layer, and the adhesion-resistant layer were formed in this order as the coating film on the base material by the arc ion plating method, and the remaining configuration except for the wear-resistant layer was common.

The base material was the same as that in Examples 1 to 12 described above.

This base material was placed at the arc ion plating device, and the intermediate layer (thickness: 0.1 μm) composed of a nitride containing Ti and Al was first formed on the base material. The nitride containing Ti and Al had a composition of $Ti_{0.5}Al_{0.5}N$ and the formation conditions were the same as those in Examples 1 to 12 described above.

Next, the wear-resistant layer having the multilayer structure including the alternately stacked A layers and B layers was formed on the intermediate layer formed as above. The configuration of the wear-resistant layer is as shown in Table 7 below and the formation conditions were the same as those in Examples 1 to 12 described above.

TABLE 7

| | wear-resistant layer | | | | | |
|---|---|---|---|---|---|---|
| | A layer | | B layer | | thickness | number | thickness |
| | composition | thickness Ta | composition | thickness Tb | ratio Tb/Ta | of stacking | T1 (μm) |
| Example 38 | $Ti_{0.8}Al_{0.2}N$ | 5 nm | $Al_{0.67}Cr_{0.33}N$ | 14 nm | 2.8 | 105 | 2 |
| Example 39 | $Ti_{0.6}Al_{0.4}N$ | 5 nm | $Al_{0.67}Cr_{0.33}N$ | 14 nm | 2.8 | 105 | 2 |
| Example 40 | $Ti_{0.4}Al_{0.6}N$ | 5 nm | $Al_{0.67}Cr_{0.33}N$ | 14 nm | 2.8 | 105 | 2 |
| Comparative Example 11 | $Ti_{0.2}Al_{0.8}N$ | 5 nm | $Al_{0.67}Cr_{0.33}N$ | 14 nm | 2.8 | 105 | 2 |
| Example 41 | $Ti_{0.5}Al_{0.5}N$ | 5 nm | $Al_{0.5}Cr_{0.5}N$ | 14 nm | 2.8 | 105 | 2 |
| Example 42 | $Ti_{0.5}Al_{0.5}N$ | 5 nm | $Al_{0.65}Cr_{0.35}N$ | 14 nm | 2.8 | 105 | 2 |
| Example 43 | $Ti_{0.5}Al_{0.5}N$ | 5 nm | $Al_{0.72}Cr_{0.28}N$ | 14 nm | 2.8 | 105 | 2 |
| Comparative Example 12 | $Ti_{0.5}Al_{0.5}N$ | 5 nm | $Al_{0.8}Cr_{0.2}N$ | 14 nm | 2.8 | 105 | 2 |

The crystal structure of this wear-resistant layer was measured by using the X-ray diffraction device, and it was confirmed that the wear-resistant layer in each of Examples had a cubic crystal structure, whereas the wear-resistant layer in each of Comparative Examples had a mixture of a cubic crystal structure and a hexagonal crystal structure.

Subsequently, the first adherent layer (thickness: 40 nm) composed of a nitride containing Ti and Al was formed on the wear-resistant layer formed as above. The nitride containing Ti and Al had a composition of $Ti_{0.5}Al_{0.5}N$ and the formation conditions were the same as those in Examples 1 to 12 described above.

Subsequently, the second adherent layer (thickness: 90 nm) having the multilayer structure including the alternately stacked C layers and D layers was formed on the first adherent layer formed as above. The C layer of a nitride containing Ti and Al had a thickness of 5.5 nm and a composition of $Ti_{0.5}Al_{0.5}N$. The D layer had a thickness of 9.5 nm and the same composition as that of the adhesion-resistant layer described below. The number of stacking of each of the C layers and the D layers was 6. The formation conditions for this second adherent layer were the same as those in Examples 1 to 12 described above.

The crystal structure of this second adherent layer was measured by using the transmission electron diffraction (TED) included with the transmission electron microscope, and it was confirmed that the C layer had a cubic crystal structure and the D layer had a wurtzite-type crystal structure.

Subsequently, the adhesion-resistant layer (thickness (T2): was formed on the second adherent layer formed as above. This adhesion-resistant layer was located at the outermost surface of the coating film and had a composition of $Al_{0.82}Cr_{0.14}Ti_{0.04}N$. The formation conditions were the same as those in Examples 1 to 12 described above.

The crystal structure of the adhesion-resistant layer thus formed was measured by using the X-ray diffraction device, and it was confirmed that the adhesion-resistant layer had a wurtzite-type crystal structure.

Ratio T2/T1 between thickness T1 of the wear-resistant layer and thickness T2 of the adhesion-resistant layer was 0.5, which was common in each of Examples 38 to 43 and Comparative Examples 11 and 12.

The surface-coated cutting tool having the coating film formed on the base material as described above was cooled, and then, the surface-coated cutting tool was taken out from the arc ion plating device, and then, the surface of the coating film was smoothed with the brush containing abrasive grains. The surface-coated cutting tools in Examples 38 to 43 and Comparative Examples 11 and 12 were thus obtained.

Examples 44 to 48

The surface-coated cutting tools in Examples 44 to 48 were fabricated as follows. Each of these surface-coated cutting tools had such a configuration that the intermediate layer, the wear-resistant layer and the adhesion-resistant layer were formed in this order as the coating film on the base material by the arc ion plating method, and the remaining configuration except for the thickness of the intermediate layer and the configuration of the wear-resistant layer was common.

The base material was the same as that in Examples 1 to 12 described above.

This base material was placed at the arc ion plating device, and the intermediate layer composed of a nitride containing Ti and Al was first formed on the base material. The nitride containing Ti and Al had a composition of $Ti_{0.5}Al_{0.5}N$ and the formation conditions were the same as those in Examples 1 to 12 described above, except that the thickness was adjusted. This intermediate layer had a thickness of 0.005 μm in Example 44, 0.04 μm in Example 45, 0.15 μm in Example 46, 0.4 μm in Example 47, and 1 μm in Example 48.

Next, the wear-resistant layer having the multilayer structure including the alternately stacked A layers and B layers was formed on the intermediate layer formed as above. The configuration of the wear-resistant layer is as shown in Table 8 below and the formation conditions were the same as those in Examples 1 to 12 described above.

The crystal structure of this wear-resistant layer was measured by using the X-ray diffraction device, and it was confirmed that the wear-resistant layer had a cubic crystal structure.

Subsequently, the adhesion-resistant layer (thickness (T2): 0.9 μm) was formed on the wear-resistant layer formed as above. This adhesion-resistant layer was located at the outermost surface of the coating film and had a composition of $Al_{0.88}Cr_{0.1}Ti_{0.02}N$. The formation conditions were the same as those in Examples 1 to 12 described above.

The crystal structure of the adhesion-resistant layer thus formed was measured by using the X-ray diffraction device, and it was confirmed that the adhesion-resistant layer had a wurtzite-type crystal structure.

Ratio T2/T1 between thickness T1 of the wear-resistant layer and thickness T2 of the adhesion-resistant layer is shown in Table 8.

TABLE 8

| | wear-resistant layer | | | | | | |
|---|---|---|---|---|---|---|---|
| | A layer | | B layer | | thickness | number | thickness | thickness |
| | composition | thickness Ta | composition | thickness Tb | ratio Tb/Ta | of stacking | T1 (μm) | ratio T2/T1 |
| Example 44 | $Ti_{0.5}Al_{0.5}N$ | 4 nm | $Al_{0.7}Cr_{0.3}N$ | 10 nm | 2.5 | 214 | 3.0 | 0.30 |
| Example 45 | $Ti_{0.5}Al_{0.5}N$ | 4 nm | $Al_{0.7}Cr_{0.3}N$ | 11 nm | 2.8 | 197 | 3.0 | 0.30 |
| Example 46 | $Ti_{0.5}Al_{0.5}N$ | 4 nm | $Al_{0.7}Cr_{0.3}N$ | 12 nm | 3.0 | 178 | 2.9 | 0.32 |
| Example 47 | $Ti_{0.5}Al_{0.5}N$ | 4 nm | $Al_{0.7}Cr_{0.3}N$ | 13 nm | 3.3 | 153 | 2.6 | 0.35 |
| Example 48 | $Ti_{0.5}Al_{0.5}N$ | 4 nm | $Al_{0.7}Cr_{0.3}N$ | 14 nm | 3.5 | 111 | 2.0 | 0.45 |

The surface-coated cutting tool having the coating film formed on the base material as described above was cooled, and then, the surface-coated cutting tool was taken out from the arc ion plating device, and then, the surface of the coating film was smoothed with the brush containing abrasive grains. The surface-coated cutting tools in Examples 44 to 48 were thus obtained.

Examples 49 to 55

The surface-coated cutting tools in Examples 49 to 55 were fabricated as follows. Each of these surface-coated cutting tools had such a configuration that the intermediate layer, the wear-resistant layer, the first adherent layer, the second adherent layer, and the adhesion-resistant layer were formed in this order as the coating film on the base material by the arc ion plating method, and the remaining configuration except for the thicknesses of the first adherent layer and the second adherent layer was common.

The base material was the same as that in Examples 1 to 12 described above.

This base material was placed at the arc ion plating device, and the intermediate layer (thickness: 0.3 μm) composed of a nitride containing Ti and Al was first formed on the base material. The nitride containing Ti and Al had a composition of $Ti_{0.5}Al_{0.5}N$ and the formation conditions were the same as those in Examples 1 to 12 described above.

Next, the wear-resistant layer (thickness: 2.8 μm) having the multilayer structure including the alternately stacked A layers and B layers was formed on the intermediate layer formed as above. The A layer of a nitride containing Ti and Al had a thickness (Ta) of 4 nm and a composition of $Ti_{0.5}Al_{0.5}N$. The B layer of a nitride containing Al and Cr had a thickness (Tb) of 10 nm and a composition of $Al_{0.7}Cr_{0.3}N$. The number of stacking of each of the A layers and the B layers was 200 and Tb/Ta=2.5. The formation conditions for this wear-resistant layer were the same as those in Examples 1 to 12 described above.

The crystal structure of this wear-resistant layer was measured by using the X-ray diffraction device, and it was confirmed that the wear-resistant layer had a cubic crystal structure.

Subsequently, the first adherent layer (thickness is as shown in Table 9) composed of a nitride containing Ti and Al was formed on the wear-resistant layer formed as above. The nitride containing Ti and Al had a composition of $Ti_{0.5}Al_{0.5}N$ and the formation conditions were the same as those in Examples 1 to 12 described above, except that the thickness was adjusted.

Subsequently, the second adherent layer (thickness and the number of stacking are as shown in Table 9) having the multilayer structure including the alternately stacked C layers and D layers was formed on the first adherent layer formed as above. The C layer of a nitride containing Ti and Al had a thickness of 9 nm and a composition of $Ti_{0.5}Al_{0.5}N$. The D layer had a thickness of 11 nm and the same composition as that of the adhesion-resistant layer described below. The formation conditions for this second adherent layer were the same as those in Examples 1 to 12 described above.

The crystal structure of this second adherent layer was measured by using transmission electron diffraction (TED) included with the transmission electron microscope, and it was confirmed that the C layer had a cubic crystal structure and the D layer had a wurtzite-type crystal structure.

TABLE 9

| | thickness of first adherent layer (μm) | thickness of second adherent layer (μm) | number of stacking of second adherent layer |
|---|---|---|---|
| Example 49 | 0.06 | 0.02 | 1 |
| Example 50 | 0.06 | 0.08 | 4 |
| Example 51 | 0.06 | 0.16 | 8 |
| Example 52 | 0.06 | 0.30 | 15 |
| Example 53 | 0.02 | 0.14 | 7 |
| Example 54 | 0.08 | 0.14 | 7 |
| Example 55 | 0.20 | 0.14 | 7 |

Subsequently, the adhesion-resistant layer (thickness (T2): 1 μm) was formed on the second adherent layer formed as above. This adhesion-resistant layer was located at the outermost surface of the coating film and had a composition of $Al_{0.82}Cr_{0.14}Ti_{0.04}N$. The formation conditions were the same as those in Examples 1 to 12 described above.

The crystal structure of the adhesion-resistant layer thus formed was measured by using the X-ray diffraction device, and it was confirmed that the adhesion-resistant layer had a wurtzite-type crystal structure.

Ratio T2/T1 between thickness T1 of the wear-resistant layer and thickness T2 of the adhesion-resistant layer was 0.36.

The surface-coated cutting tool having the coating film formed on the base material as described above was cooled, and then, the surface-coated cutting tool was taken out from the arc ion plating device, and then, the surface of the coating film was smoothed with the brush containing abrasive grains. The surface-coated cutting tools in Examples 49 to 55 were thus obtained.

<Evaluation>

By conducting cutting tests 1 to 5 described below, the surface-coated cutting tools in Examples/Comparative Examples were evaluated.

<Cutting Test 1>

By using the surface-coated cutting tool in each of Examples 1 to 12 and 25 to 30 as well as Comparative Examples 1 to 5 and 10, holes were bored in the workpiece material under the following conditions, and the number of holes until breakage occurred was counted. Breakage of the drill is caused by adhesion of the workpiece material to the blade edge. Therefore, as the number of holes becomes larger, the adhesion resistance becomes more excellent and the tool life becomes more excellent. The result is shown in Table 10.

(Processing Conditions)
workpiece material: SCM415 raw material
cutting speed: V=80 m/min
amount of feed per rotation: f=0.2 mm/rev.
depth of one hole: H=40 mm
oil supply method: external oil supply method (cutting liquid=emulsion)

TABLE 10

|  | cutting test 1 (number of holes) |
|---|---|
| Example 1 | 701 |
| Example 2 | 852 |
| Example 3 | 811 |
| Example 4 | 564 |
| Example 5 | 423 |
| Example 6 | 1019 |
| Example 7 | 925 |
| Example 8 | 876 |
| Example 9 | 900 |
| Example 10 | 317 |
| Example 11 | 303 |
| Example 12 | 498 |
| Example 25 | 295 |
| Example 26 | 481 |
| Example 27 | 697 |
| Example 28 | 752 |
| Example 29 | 708 |
| Example 30 | 554 |
| Comparative Example 1 | 176 |
| Comparative Example 2 | 82 |
| Comparative Example 3 | 85 |
| Comparative Example 4 | 155 |
| Comparative Example 5 | 180 |
| Comparative Example 10 | 50 |

<Cutting Test 2>

By using the surface-coated cutting tool in each of Examples 44 to 55, holes were bored in the workpiece material under the same conditions as those for cutting test 1, and the state of the blade edge was observed every 50 holes. Then, the number of holes when peeloff of the adhesion-resistant layer or the entire coating film was observed for the first time was checked. As the number of holes becomes larger, the peeloff resistance of the coating film becomes more excellent. The result is shown in Table 11.

TABLE 11

|  | cutting test 2 (number of holes) |
|---|---|
| Example 44 | 300 |
| Example 45 | 600 |
| Example 46 | 900 |
| Example 47 | 750 |
| Example 48 | 150 |
| Example 49 | 200 |
| Example 50 | 600 |
| Example 51 | 600 |
| Example 52 | 400 |
| Example 53 | 200 |
| Example 54 | 600 |
| Example 55 | 400 |

<Cutting Test 3>

By using the surface-coated cutting tool in each of Examples 4, 6 and 17 to 43 as well as Comparative Examples 6 to 9, 11 and 12, holes were bored in the workpiece material under the following conditions, and the number of holes until chipping of the thinning portion or the blade edge occurred was counted. Chipping thereof is caused by adhesion of the workpiece material. Therefore, as the number of holes becomes larger, the adhesion resistance becomes more excellent and the tool life becomes more excellent. The result is shown in Table 12.

(Processing Conditions)
workpiece material: S50C (HB230)
cutting speed: V=80 m/min
amount of feed per rotation: f=0.25 mm/rev. depth of one hole: H=40 mm
oil supply method: internal oil supply method (cutting liquid=emulsion)

TABLE 12

|  | cutting test 3 | |
|---|---|---|
| No. | | number of holes |
| Example 4 | | 775 |
| Example 6 | | 788 |
| Example 17 | | 377 |
| Example 18 | | 474 |
| Example 19 | | 596 |
| Example 20 | | 1008 |
| Example 21 | | 1213 |
| Example 22 | | 800 |
| Example 23 | | 589 |
| Example 24 | | 394 |
| Example 25 | | 802 |
| Example 26 | | 763 |
| Example 27 | | 717 |
| Example 28 | | 689 |
| Example 29 | | 631 |
| Example 30 | | 505 |
| Example 31 | | 523 |
| Example 32 | | 602 |
| Example 33 | | 706 |
| Example 34 | | 725 |
| Example 35 | | 795 |
| Example 36 | | 586 |
| Example 37 | | 553 |
| Example 38 | | 337 |
| Example 39 | | 825 |
| Example 40 | | 992 |
| Example 41 | | 330 |
| Example 42 | | 660 |
| Example 43 | | 975 |
| Comparative Example 6 | | 266 |

TABLE 12-continued cutting test 3

| No. | number of holes |
|---|---|
| Comparative Example 7 | 276 |
| Comparative Example 8 | 307 |
| Comparative Example 9 | 236 |
| Comparative Example 11 | 236 |
| Comparative Example 12 | 242 |
| — | — |

<Cutting Test 4>

By using the surface-coated cutting tool in each of Examples 13 to 24, 200 holes were bored in the workpiece material under the same conditions as those for cutting test 3, and thereafter, margin damage was observed by using a microscope. Then, a length (mm), from the tip, of a range where a feed mark or peeloff of the coating film occurred at a margin portion was measured. As this length becomes shorter, the cutting properties such as adhesion resistance, wear resistance and toughness become more excellent. The result is shown in Table 13.

TABLE 13

| | cutting test 4 (length (mm)) |
|---|---|
| Example 13 | 0.4 |
| Example 14 | 0.3 |
| Example 15 | 0.25 |
| Example 16 | 0.2 |
| Example 17 | 0.2 mm or shorter |
| Example 18 | 0.25 |
| Example 19 | 0.3 |
| Example 20 | 0.45 |
| Example 21 | 1.0 |
| Example 22 | 2.0 |
| Example 23 | 3.8 |
| Example 24 | 5.1 |

<Cutting Test 5>

By using the surface-coated cutting tool in each of Examples 31 to 37, 1000 holes were bored in the workpiece material under the following conditions, and thereafter, a wear width (mm) on the outer circumferential side of the flank face was measured by microscopic observation of the drill. As the wear width becomes smaller, the wear resistance becomes more excellent. The result is shown in Table 14.

(Processing Conditions)
workpiece material: S50C (HB230)
cutting speed: V=130 m/min
amount of feed per rotation: f=0.25 mm/rev.
depth of one hole: H=40 mm
oil supply method: internal oil supply method (cutting liquid=emulsion)

TABLE 14

| | cutting test 5 (wear width (mm)) |
|---|---|
| Example 31 | 0.15 |
| Example 32 | 0.15 |
| Example 33 | 0.07 |

TABLE 14-continued cutting test 5 (wear width (mm))

| Example 34 | 0.05 |
|---|---|
| Example 35 | 0.11 |
| Example 36 | 0.26 |
| Example 37 | 0.31 |

As is clear from Tables 10 to 14, it was confirmed that the surface-coated cutting tool according to the present invention achieves excellent wear resistance and excellent adhesion resistance, and thus, achieves an excellent effect of preventing chipping and breakage very effectively.

Examples 56 to 58 and Comparative Examples 13 and 14

The surface-coated cutting tools in Examples 56 to 58 and Comparative Examples 13 and 14 were fabricated as follows. Each of these surface-coated cutting tools had such a configuration that the intermediate layer, the wear-resistant layer, the first adherent layer, the second adherent layer, and the adhesion-resistant layer were formed in this order as the coating film on the base material by the arc ion plating method, and the remaining configuration except for the adhesion-resistant layer was common.

A drill (blade diameter: diameter of 6.0 mm, overall length: 100 mm, groove length: 48 mm, with an oil hole) made of cemented carbide and a plate (20 mm×10 mm×1 mm) made of cemented carbide were used as the base materials.

Each of these base materials was placed at the arc ion plating device, and the intermediate layer (thickness: 0.4 μm) composed of a nitride containing Ti and Al was first formed on the base material. The nitride containing Ti and Al had a composition of $Ti_{0.6}Al_{0.4}N$ and the formation conditions were the same as those in Examples 1 to 12 described above.

Next, the wear-resistant layer (thickness (T1): 4.5 μm) having the multilayer structure including the alternately stacked A layers and B layers was formed on the intermediate layer formed as above. The A layer of a nitride containing Ti and Al had a thickness (Ta) of 8 nm and a composition of $Ti_{0.6}Al_{0.4}N$. The B layer of a nitride containing Al and Cr had a thickness (Tb) of 15 nm and a composition of $Al_{0.7}Cr_{0.3}N$. The number of stacking of each of the A layers and the B layers was 196 and thickness ratio Tb/Ta=1.9. The formation conditions for this wear-resistant layer were the same as those in Examples 1 to 12 described above.

The crystal structure of this wear-resistant layer was measured by using the X-ray diffraction device, and it was confirmed that the wear-resistant layer had a cubic crystal structure.

Subsequently, the first adherent layer (thickness: 60 nm) composed of a nitride containing Ti and Al was formed on the wear-resistant layer formed as above. The nitride containing Ti and Al had a composition of $Ti_{0.6}Al_{0.4}N$ and the formation conditions were the same as those in Examples 1 to 12 described above.

Subsequently, the second adherent layer (thickness: 40 nm) having the multilayer structure including the alternately stacked C layers and D layers was formed on the first adherent layer formed as above. The C layer of a nitride containing Ti and Al had a thickness of 5 nm and a composition of $Ti_{0.6}Al_{0.4}N$. The D layer had a thickness of 5 nm and the same composition as that of the adhesion-resistant layer described below. The number of stacking of each of the C layers and the D layers was 4. The formation conditions for this second adherent layer were the same as those in Examples 1 to 12 described above.

The crystal structure of this second adherent layer was measured by using transmission electron diffraction (TED) included with the transmission electron microscope, and it was confirmed that the C layer had a cubic crystal structure and the D layer had a wurtzite-type crystal structure.

Next, the adhesion-resistant layer (thickness (T2): 1.5 which was common) was formed on the second adherent layer formed as above. This adhesion-resistant layer was located at the outermost surface of the coating film and had a composition shown in Table 15 below. The formation conditions were the same as those in Examples 1 to 12 described above.

TABLE 15

|  | composition of adhesion-resistant layer | hardness ratio H2/H1 |
|---|---|---|
| Example 56 | $Al_{0.85}Cr_{0.02}Ti_{0.13}N$ | 0.8 |
| Example 57 | $Al_{0.85}Cr_{0.11}Ti_{0.04}N$ | 0.95 |
| Example 58 | $Al_{0.85}Cr_{0.12}Ti_{0.03}N$ | 1.05 |
| Comparative Example 13 | $Al_{0.70}Cr_{0.23}Ti_{0.07}N$ | 0.6 |
| Comparative Example 14 | $Al_{0.9}Cr_{0.1}N$ | 1.2 |

The crystal structure of the adhesion-resistant layer thus formed was measured by using the X-ray diffraction device, and it was confirmed that the adhesion-resistant layer had a wurtzite-type crystal structure.

Ratio T2/T1 between thickness T1 of the wear-resistant layer and thickness T2 of the adhesion-resistant layer was 0.33.

By using a nanoindenter, hardness measurement near the surfaces of the wear-resistant layer and the adhesion-resistant layer was performed on the coating film formed on the plate made of cemented carbide as the base material. Hardness ratio H2/H1, which is the ratio between hardness H1 of the wear-resistant layer and hardness H2 (measured from the surface) of the adhesion-resistant layer, is shown in Table 15.

The surface-coated cutting tool having the coating film formed on the base material as described above was cooled, and then, the surface-coated cutting tool was taken out from the arc ion plating device, and then, the surface of the coating film was smoothed with the brush containing abrasive grains. The surface-coated cutting tools in Examples 56 to 58 and Comparative Examples 13 and 14 were thus obtained.

Examples 59 to 63

The surface-coated cutting tools were fabricated in completely the same manner as in Example 57 described above, except that the bias voltage during film formation is as shown in Table 16 below. The wear-resistant layer in each of these Examples had a cubic crystal structure. The second adherent layer and the adhesion-resistant layer in each of these Examples had a wurtzite-type crystal structure.

An amount of warpage before and after film formation on the plate (base material) made of cemented carbide was measured, and the film thickness of the formed coating film was measured by using the Calotest, and the stress of the coating film was calculated. The result is shown in Table 16.

TABLE 16

|  | bias voltage (V) during film formation | | | | | |
|---|---|---|---|---|---|---|
|  | intermediate layer | wear-resistant layer | first adherent layer | second adherent layer | adhesion-resistant layer | stress (GPa) |
| Example 59 | 20 | 20 | 30 | 30 | 30 | −0.5 |
| Example 60 | 50 | 50 | 100 | 100 | 100 | −1.8 |
| Example 61 | 50 | 100 | 100 | 100 | 100 | −2.4 |
| Example 62 | 0 | 0 | 0 | 0 | 0 | 0 |
| Example 63 | 120 | 120 | 120 | 120 | 120 | −4 |

Examples 64 to 78

The surface-coated cutting tools in Examples 64 to 78 were fabricated as follows. Each of these surface-coated cutting tools had such a configuration that the intermediate layer, the wear-resistant layer, the first adherent layer, the second adherent layer, and the adhesion-resistant layer were formed in this order as the coating film on the base material by the arc ion plating method, and the configuration was common in each Example.

The drill (blade diameter: diameter of 6.0 mm, overall length: 100 mm, groove length: 48 mm, with an oil hole) made of cemented carbide was used as the base material.

This base material was placed at the arc ion plating device, and the intermediate layer (thickness: 0.3 μm) composed of a nitride containing Ti and Al was first formed on the base material. The nitride containing Ti and Al had a composition of $Ti_{0.55}Al_{0.45}N$ and the formation conditions were the same as those in Examples 1 to 12 described above.

Next, the wear-resistant layer (thickness (T1): 4.5 μm) having the multilayer structure including the alternately stacked A layers and B layers was formed on the intermediate layer formed as above. The A layer of a nitride containing Ti and Al had a thickness (Ta) of 8 nm and a composition of $Ti_{0.55}Al_{0.45}N$. The B layer of a nitride containing Al and Cr had a thickness (Tb) of 15 nm and a composition of $Al_{0.7}Cr_{0.3}N$. The number of stacking of each of the A layers and the B layers was 196 and thickness ratio Tb/Ta=1.9. The formation conditions for this wear-resistant layer were as follows:

target: $Ti_{0.55}Al_{0.45}$ (A layer), $Al_{0.7}Cr_{0.3}$ (B layer)

pressure: 5 Pa, film formation by putting Ar at an amount of 10% into $N_2$ discharge current: 100 A (A layer), 180 A (B layer)

bias voltage: as shown in Tables 17, 18 and 19 film formation temperature: as shown in Tables 17, 18 and 19.

The aforementioned targets were placed at a prescribed position in the furnace of the arc ion plating device, and the base material was rotated with the base material facing each target. While adjusting the rotation speed, the wear-resistant layer having the multilayer structure including the alternately stacked A layers and B layers was formed.

The crystal structure of this wear-resistant layer was measured by using the X-ray diffraction device, and it was confirmed that the wear-resistant layer had a cubic crystal structure.

Subsequently, the first adherent layer (thickness: 30 nm) composed of a nitride containing Ti and Al was formed on the wear-resistant layer formed as above. The nitride containing Ti and Al had a composition of $Ti_{0.55}Al_{0.45}N$ and the formation conditions were the same as those for the aforementioned wear-resistant layer.

Subsequently, the second adherent layer (thickness: 60 nm) having the multilayer structure including the alternately stacked C layers and D layers was formed on the first adherent layer formed as above. The C layer of a nitride containing Ti and Al had a thickness of 6 nm and a composition of $Ti_{0.55}Al_{0.45}N$. The D layer had a thickness of 6 nm and the same composition as that of the adhesion-resistant layer described below.

The number of stacking of each of the C layers and the D layers was 5. The formation conditions for this second adherent layer were the same as those for the wear-resistant layer (C layer) described above and the adhesion-resistant layer (D layer) described below.

The crystal structure of this second adherent layer was measured by using transmission electron diffraction (TED) included with the transmission electron microscope, and it was confirmed that the C layer had a cubic crystal structure and the D layer had a wurtzite-type crystal structure.

Next, the adhesion-resistant layer (thickness (T2): 1.5 μm, which was common) was formed on the second adherent layer formed as above. This adhesion-resistant layer was located at the outermost surface of the coating film and had a composition of $Al_{0.85}Cr_{0.11}Ti_{0.04}N$. The formation conditions were as follows:
target: $Al_{0.85}Cr_{0.11}Ti_{0.04}$
discharge current: 150 A
bias voltage: as shown in Tables 17, 18 and 19
film formation temperature: as shown in Tables 17, 18 and 19.

The crystal structure of the adhesion-resistant layer thus formed was measured by using the X-ray diffraction device, and it was confirmed that the adhesion-resistant layer had a wurtzite-type crystal structure.

Ratio T2/T1 between thickness T1 of the wear-resistant layer and thickness T2 of the adhesion-resistant layer was 0.33.

The surface-coated cutting tool having the coating film formed on the base material as described above was cooled, and then, the surface-coated cutting tool was taken out from the arc ion plating device, and then, the surface of the coating film was smoothed with the brush containing abrasive grains. The surface-coated cutting tools in Examples 64 to 78 were thus obtained.

The measurement conditions of the X-ray diffraction pattern of the coating film thus formed were as follows:
measurement site: flank face of the drill
used X-ray: Cu-Kα
excitation condition: 45 kV 200 mA
used collimator: ϕ0.3 mm
measurement method: θ-2θ method.

Table 17 shows strength ratio K2/K1, assuming that K1 represents the peak strength near 2θ=36° and K2 represents the peak strength near 2θ=37.4°, in each of Examples 64 to 68. K1 is considered to represent the peak strength of the hexagonal crystal (002) in the adhesion-resistant layer, and K2 is considered to represent the peak strength of the cubic crystal (111) in the wear-resistant layer.

Table 18 shows strength ratio K2/K1, assuming that K1 represents the peak strength near 2θ=37.4° and K2 represents the peak strength near 2θ=37.9°, in each of Examples 69 to 73. K1 is considered to represent the peak strength of the cubic crystal (111) in the wear-resistant layer, and K2 is considered to represent the peak strength of the hexagonal crystal (101) in the adhesion-resistant layer.

Table 19 shows strength ratio K2/K1, assuming that K1 represents the peak strength near 2θ=37.4° and K2 represents the peak strength near 2θ=43.2°, in each of Examples 74 to 78. K1 is considered to represent the peak strength of the cubic crystal (111) in the wear-resistant layer, and K2 is considered to represent the peak strength of the cubic crystal (200) in the adhesion-resistant layer.

TABLE 17

| | formation conditions for wear-resistant layer | | formation conditions for adhesion-resistant layer | | X-ray diffraction |
|---|---|---|---|---|---|
| | bias voltage (V) | film formation temperature (° C.) | bias voltage (V) | film formation temperature (° C.) | peak strength ratio K2/K1 |
| Example 64 | 50 | 500 | 100 | 550 | 0.21 |
| Example 65 | 50 | 500 | 100 | 500 | 0.28 |
| Example 66 | 50 | 500 | 70 | 450 | 0.33 |
| Example 67 | 30 | 500 | 120 | 550 | 0.17 |
| Example 68 | 55 | 550 | 70 | 450 | 0.38 |

TABLE 18

| | formation conditions for wear-resistant layer | | formation conditions for adhesion-resistant layer | | X-ray diffraction |
|---|---|---|---|---|---|
| | bias voltage (V) | film formation temperature (° C.) | bias voltage (V) | film formation temperature (° C.) | peak strength ratio K2/K1 |
| Example 69 | 50 | 500 | 30 | 500 | 0.43 |
| Example 70 | 40 | 500 | 40 | 500 | 0.52 |
| Example 71 | 40 | 500 | 50 | 500 | 0.58 |
| Example 72 | 60 | 500 | 30 | 450 | 0.3 |
| Example 73 | 40 | 450 | 50 | 550 | 0.67 |

TABLE 19

| | formation conditions for wear-resistant layer | | formation conditions for adhesion-resistant layer | | X-ray diffraction |
|---|---|---|---|---|---|
| | bias voltage (V) | film formation temperature (° C.) | bias voltage (V) | film formation temperature (° C.) | peak strength ratio K2/K1 |
| Example 74 | 60 | 500 | 30 | 400 | 0.62 |
| Example 75 | 50 | 500 | 30 | 400 | 0.69 |
| Example 76 | 40 | 500 | 30 | 400 | 0.72 |
| Example 77 | 70 | 500 | 30 | 400 | 0.5 |
| Example 78 | 30 | 500 | 30 | 400 | 0.83 |

Examples 79 to 83

The surface-coated cutting tools were fabricated in completely the same manner as in Example 57 described above, except that the film formation temperature of the wear-resistant layer is as shown in Table 20 below. The wear-resistant layer in each of these Examples had a cubic crystal structure. The second adherent layer and the adhesion-resistant layer in each of these Examples had a wurtzite-type crystal structure.

The cross section of the wear-resistant layer thus formed was observed by using the transmission electron microscope (TEM), and formation of columnar crystals was confirmed. An average grain size of the columnar crystals in the wear-resistant layer in each of Examples 79 to 83 is shown in Table 20 (section of "average grain size of wear-resistant layer").

TABLE 20

| | film formation temperature of wear-resistant layer (° C.) | average grain size of wear-resistant layer (nm) |
|---|---|---|
| Example 79 | 400 | 168 |
| Example 80 | 500 | 198 |
| Example 81 | 600 | 237 |
| Example 82 | 300 | 135 |
| Example 83 | 650 | 282 |

Examples 84 to 87

The surface-coated cutting tools were fabricated in completely the same manner as in Example 57 described above, except that the composition and the film formation temperature of the adhesion-resistant layer are as shown in Table 21 below. The wear-resistant layer in each of these Examples had a cubic crystal structure. The second adherent layer and the adhesion-resistant layer in each of these Examples had a wurtzite-type crystal structure.

The cross section of the adhesion-resistant layer thus formed was observed by using the transmission electron microscope (TEM), and formation of nanoparticles was confirmed. An average grain size of the nanoparticles in the adhesion-resistant layer in each of Examples 84 to 87 is shown in Table 21 (section of "average grain size of adhesion-resistant layer").

TABLE 21

| | composition of adhesion-resistant layer | film formation temperature of adhesion-resistant layer (° C.) | average grain size of adhesion-resistant layer (nm) |
|---|---|---|---|
| Example 84 | $Al_{0.83}Cr_{0.13}Ti_{0.04}N$ | 450 | 6 |
| Example 85 | $Al_{0.85}Cr_{0.11}Ti_{0.04}N$ | 480 | 8 |
| Example 86 | $Al_{0.85}Cr_{0.11}Ti_{0.04}N$ | 520 | 15 |
| Example 87 | $Al_{0.85}Cr_{0.11}Ti_{0.04}N$ | 550 | 32 |

<Cutting Test 6>

By using the surface-coated cutting tool (the drill made of cemented carbide was used as the base material) in each of Examples 56 to 87 and Comparative Examples 13 and 14, holes were bored in the workpiece material under the following conditions, and the number of holes until chipping of the blade edge or breakage of the drill occurred was counted. Chipping is caused by adhesion of the workpiece material due to peeloff of the film or exhaustion of the adhesion-resistant layer. Therefore, as the number of holes becomes larger, the adhesion resistance becomes more excellent and the tool life becomes more excellent. In addition, breakage occurs due to worsened chip dischargeability caused by loss of the adhesion-resistant layer. Therefore, as the number of holes becomes larger, the adhesion resistance becomes more excellent and the tool life becomes more excellent. The result is shown in Table 22.

<Processing Conditions>
workpiece material: S50C (HB230)
cutting speed: V=130 m/min
amount of feed per rotation: f=0.25 mm/rev.
depth of one hole: H=40 mm
oil supply method: internal oil supply method (cutting liquid=emulsion)

As for Examples 79 to 83, evaluation was made under the conditions for cutting test 5 and the result is shown in Table 23.

TABLE 22

| | cutting test 6 |
|---|---|
| No. | number of holes |
| Example 56 | 1052 |
| Example 57 | 1117 |
| Example 58 | 1001 |
| Example 59 | 879 |
| Example 60 | 1259 |
| Example 61 | 987 |
| Example 62 | 664 |
| Example 63 | 543 |
| Example 64 | 962 |
| Example 65 | 1046 |
| Example 66 | 897 |
| Example 67 | 776 |

TABLE 22-continued cutting test 6

| No. | number of holes |
|---|---|
| Example 68 | 823 |
| Example 69 | 1023 |
| Example 70 | 974 |
| Example 71 | 1167 |
| Example 72 | 791 |
| Example 73 | 764 |
| Example 74 | 936 |
| Example 75 | 948 |
| Example 76 | 920 |
| Example 77 | 579 |
| Example 78 | 654 |
| Example 84 | 1201 |
| Example 85 | 1065 |
| Example 86 | 998 |
| Example 87 | 765 |
| Comparative Example 13 | 287 |
| Comparative Example 14 | 359 |
| — | — |

TABLE 23

| | cutting test 5 (wear width (mm)) |
|---|---|
| Example 79 | 0.1 |
| Example 80 | 0.12 |
| Example 81 | 0.09 |
| Example 82 | 0.4 |
| Example 83 | 0.38 |

While the embodiments and the examples of the present invention have been described above, it is originally intended to appropriately combine the configurations of the aforementioned embodiments and examples.

It should be understood that the embodiments and the examples disclosed herein are illustrative and not limitative in any respect. The scope of the present invention is defined by the terms of the claims, rather than the description above, and is intended to include any modifications within the scope and meaning equivalent to the terms of the claims.

The invention claimed is:

1. A surface-coated cutting tool including a base material and a coating film formed on the base material, wherein
said coating film includes at least a wear-resistant layer and an adhesion-resistant layer,
said wear-resistant layer has a multilayer structure in which an A layer of a nitride containing Ti and Al as well as a B layer of a nitride containing Al and Cr are alternately stacked, and has a cubic crystal structure, and
said adhesion-resistant layer is located at an outermost surface of said coating film, is composed of a nitride expressed by $(Al_aCr_bTi_{1-a-b})N$ (wherein a+b<0.99, b>0.01, and 0.2b+0.7<a), and has a wurtzite-type crystal structure.

2. The surface-coated cutting tool according to claim 1, wherein
in the whole of said coating film, an atomic ratio of Al to all metal atoms is higher than 0.6 and equal to or lower than 0.8, and an atomic ratio of Cr to all metal atoms is higher than 0.15 and equal to or lower than 0.3.

3. The surface-coated cutting tool according to claim 1, wherein
said coating film has a thickness of 2 to 30 µm.

4. The surface-coated cutting tool according to claim 1, wherein
said adhesion-resistant layer has a thickness of 0.5 to 8 µm.

5. The surface-coated cutting tool according to claim 1, wherein
assuming that T1 represents a thickness of said wear-resistant layer and T2 represents a thickness of said adhesion-resistant layer, a thickness ratio T2/T1 satisfies a relationship of 0.17≤T2/T1≤0.55.

6. The surface-coated cutting tool according to claim 1, wherein
assuming that Ta represents an average thickness of said A layer and Tb represents an average thickness of said B layer, a thickness ratio Tb/Ta satisfies a relationship of 1.5≤Tb/Ta≤4.

7. The surface-coated cutting tool according to claim 6, wherein
said Ta is 1 to 10 nm and said Tb is 1.5 to 30 nm.

8. The surface-coated cutting tool according to claim 1, wherein
said A layer is composed of a nitride expressed by $(Ti_{1-c}Al_c)N$ (wherein 0.3<c ≤0.7), and
said B layer is composed of a nitride expressed by $(Al_eCr_{1-e})N$ (wherein 0.6<e<0.75).

9. The surface-coated cutting tool according to claim 1, wherein
said coating film has an intermediate layer between said base material and said wear-resistant layer, and
said intermediate layer is composed of a nitride containing Ti and Al, and has a thickness of 0.01 to 0.5 µm.

10. The surface-coated cutting tool according to claim 1, wherein
said coating film has a first adherent layer and a second adherent layer between said wear-resistant layer and said adhesion-resistant layer,
said first adherent layer is located between said wear-resistant layer and said second adherent layer, is composed of a nitride containing Ti and Al, and has a thickness of 30 nm to 0.1 µm, and
said second adherent layer has a multilayer structure in which a C layer being of a nitride containing Ti and Al and having the same crystal structure as that of said wear-resistant layer as well as a D layer having the same composition as that of said adhesion-resistant layer are alternately stacked, and has a thickness of 10 nm to 0.2 µm.

11. The surface-coated cutting tool according to claim 1, wherein
assuming that H1 represents a hardness of said wear-resistant layer and H2 represents a hardness measured from a surface of said adhesion-resistant layer, a hardness ratio H2/H1 satisfies a relationship of 0.7<H2/H1<1.1.

12. The surface-coated cutting tool according to claim 1, wherein
assuming that H1 represents a hardness of said wear-resistant layer and H2 represents a hardness measured from a surface of said adhesion-resistant layer, a hardness ratio H2/H1 satisfies a relationship of 0.9<H2/H1<1.0.

13. The surface-coated cutting tool according to claim 1, wherein
said coating film has a compressive stress of −0.1 GPa or less and −3.0 GPa or more.

14. The surface-coated cutting tool according to claim 1, wherein
said coating film has a compressive stress of −1.0 GPa or less and −2.5 GPa or more.

15. The surface-coated cutting tool according to claim 1, wherein
  assuming that K1 represents a peak strength near 2θ=36° and K2 represents a peak strength near 2θ=37.4°, said coating film has an X-ray diffraction pattern in which a strength ratio K2/K1 satisfies a relationship of 0.2<K2/K1<0.35.

16. The surface-coated cutting tool according to claim 1, wherein
  assuming that K1 represents a peak strength near 2θ=37.4° and K2 represents a peak strength near 2θ=37.9°, said coating film has an X-ray diffraction pattern in which a strength ratio K2/K1 satisfies a relationship of 0.4<K2/K1<0.6.

17. The surface-coated cutting tool according to claim 1, wherein
  assuming that K1 represents a peak strength near 2θ=37.4° and K2 represents a peak strength near 2θ=43.2°, said coating film has an X-ray diffraction pattern in which a strength ratio K2/K1 satisfies a relationship of 0.6<K2/K1<0.75.

18. The surface-coated cutting tool according to claim 1, wherein
  said wear-resistant layer has a structure of columnar crystals and an average grain size of the columnar crystals is larger than 150 nm and equal to or smaller than 250 nm.

19. The surface-coated cutting tool according to claim 1, wherein
  said adhesion-resistant layer has a structure of nanoparticles and an average grain size of the nanoparticles is equal to or smaller than 40 nm.

\* \* \* \* \*